(12) United States Patent
Blakemore et al.

(10) Patent No.: US 8,897,940 B2
(45) Date of Patent: Nov. 25, 2014

(54) BATTERY CELL VOLTAGE BALANCING SYSTEM AND METHOD

(75) Inventors: Bruce Carvell Blakemore, Plymouth, MI (US); Allan Roy Gale, Livonia, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 196 days.

(21) Appl. No.: 13/192,510

(22) Filed: Jul. 28, 2011

(65) Prior Publication Data

US 2013/0030617 A1    Jan. 31, 2013

(51) Int. Cl.
| | |
|---|---|
| *B60L 9/00* | (2006.01) |
| *B60L 11/18* | (2006.01) |
| *B60L 11/14* | (2006.01) |
| *G01R 31/36* | (2006.01) |
| *H02J 7/04* | (2006.01) |
| *H02J 7/00* | (2006.01) |

(52) U.S. Cl.
CPC .............. *B60L 11/18* (2013.01); *Y02T 10/7055* (2013.01); *B60L 11/1816* (2013.01); *Y02T 10/7088* (2013.01); *B60L 2240/549* (2013.01); *H02J 7/0055* (2013.01); *Y02T 10/7005* (2013.01); *H02J 7/0016* (2013.01); *Y02T 10/7077* (2013.01); *B60L 11/14* (2013.01); *G01R 31/36* (2013.01); *B60L 2240/547* (2013.01); *B60L 11/1866* (2013.01); *Y02T 90/121* (2013.01); *Y02T 90/14* (2013.01); *H02J 7/044* (2013.01); *Y02T 10/7061* (2013.01); *B60L 2240/545* (2013.01); *B60L 11/1862* (2013.01)

USPC .......................................................... 701/22

(58) Field of Classification Search
USPC .......................................................... 701/22
See application file for complete search history.

(56) References Cited

U.S. PATENT DOCUMENTS

| | | | |
|---|---|---|---|
| 4,079,303 A | 3/1978 | Cox | |
| 5,659,237 A * | 8/1997 | Divan et al. ................... | 320/119 |
| 5,782,880 A | 7/1998 | Lahtinen et al. | |
| 5,869,951 A | 2/1999 | Takahashi | |
| 6,451,463 B1 * | 9/2002 | Tsai et al. ......................... | 429/9 |
| 6,646,419 B1 | 11/2003 | Ying | |
| 7,091,700 B2 | 8/2006 | Kadouchi et al. | |
| 7,245,108 B2 | 7/2007 | Chertok et al. | |
| 7,274,170 B2 | 9/2007 | Benckenstein, Jr. et al. | |
| 7,489,106 B1 * | 2/2009 | Tikhonov ...................... | 320/116 |
| 8,207,740 B2 | 6/2012 | Lin et al. | |
| 2003/0152830 A1* | 8/2003 | Eaves ............................. | 429/156 |
| 2006/0119319 A1 | 6/2006 | Sakurai et al. | |
| 2007/0257641 A1 | 11/2007 | Sada et al. | |
| 2008/0197707 A1 | 8/2008 | Chi Yang | |
| 2010/0261048 A1 * | 10/2010 | Kim et al. ...................... | 429/150 |
| 2011/0025258 A1 | 2/2011 | Kim et al. | |
| 2011/0078092 A1 | 3/2011 | Kim et al. | |
| 2011/0093223 A1* | 4/2011 | Quet ............................... | 702/60 |

* cited by examiner

*Primary Examiner* — Behrang Badii
*Assistant Examiner* — Daniel L Greene
(74) *Attorney, Agent, or Firm* — David B. Kelley; Brooks Kushman P.C.

(57) ABSTRACT

A vehicle may include an electric machine that generates motive power for the vehicle, a plurality of cells that store energy for the electric machine, and at least one controller. The at least one controller may cause the cells to receive current for a period of time and, during the period of time, cause at least some of the cells to supply cell load current such that at the expiration of the period of time, the amount of energy stored by the cells is at least equal to a predetermined target energy level.

12 Claims, 4 Drawing Sheets

BATTERY CELL VOLTAGE BALANCING SYSTEM AND METHOD

BACKGROUND

Vehicle battery rebalancing is performed to correct cell voltage imbalance conditions. For example, the voltage of each of the cells is measured and the cell having the minimum voltage identified. All other cells are bled down via resistive circuitry associated with each cell until the other cells have a measured voltage approximately equal to the minimum. Continuous/periodic cell voltage measurements are taken during the bleed down process to monitor change in the cell voltages. Once all of the cell voltage readings are approximately equal, the battery is charged.

SUMMARY

A power system may include a battery having a plurality of cells. The power system may further include at least one controller configured to cause the cells to acquire charge for a period of time such that at the expiration of the period of time, the voltages of the cells are approximately equal. The rate at which charge is acquired by the cells may be different among at least some of the cells for at least a determined portion of the period of time.

DETAILED DESCRIPTION

Figure 1:
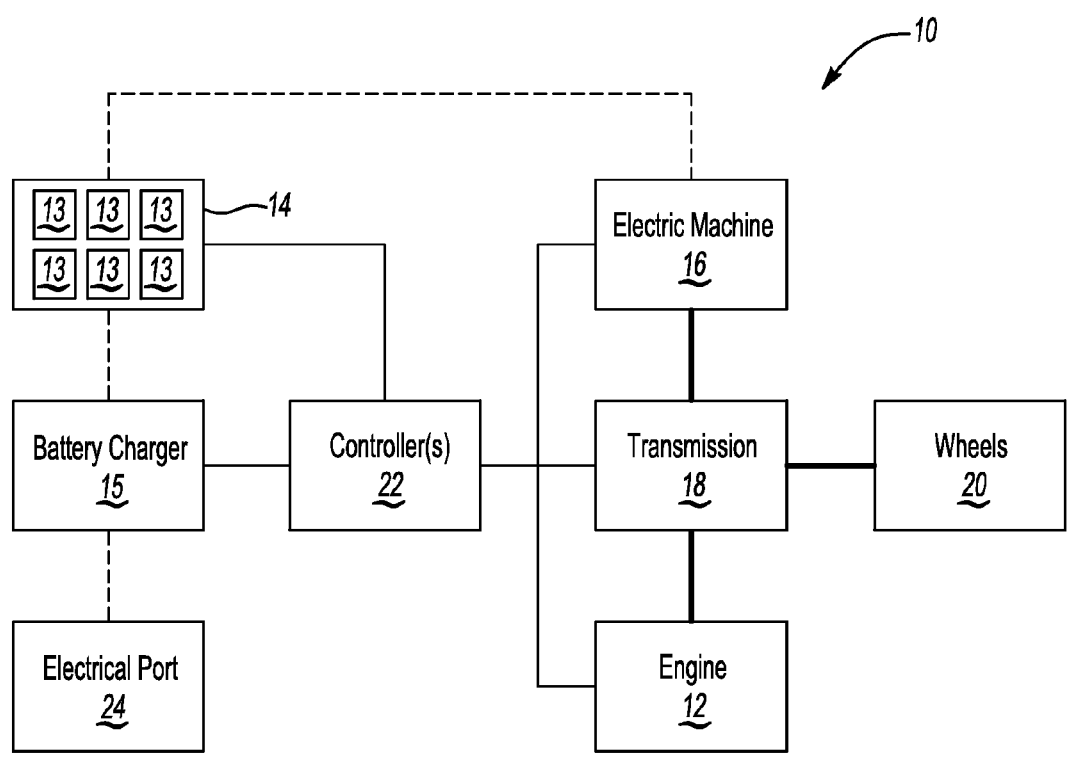
FIG. 1 is a block diagram of an alternatively powered vehicle.

Of the total time taken to rebalance and charge a battery, up to 50% of this time (or more) may be dedicated to rebalancing. A plug-in hybrid electric vehicle (PHEV) or battery electric vehicle (BEV) having a 1.5 kw charger and a 6 kwhr battery with cell imbalances (and 1.5 kwhr of energy remaining), for example, may spend 1.5 hours rebalancing the battery and another 3 hours charging the battery (to full capacity).

A PHEV or BEV vehicle owner may desire to minimize the time spent rebalancing and charging their battery. Certain embodiments disclosed herein may provide systems and techniques that attempt to reduce the time spent rebalancing and charging vehicle batteries.

Cell Capacity

A battery cell's maximum capacity, $Ihr_{max}$, may be found according to the relationship $$Ihr_{max} = \frac{\Delta Ihr}{\Delta SOC} \quad (1)$$

where $\Delta Ihr$ is the change in capacity in the cell and $\Delta SOC$ is the change in state of charge of the cell. As an example, the SOC of a given cell may be determined before and after 1 A·hr of capacity is provided to it. Assuming a $\Delta SOC$ of 10% for this example, the cell's maximum capacity, $Ihr_{max}$, would be 10 A·hrs according to (1).

Cell Energy Content

A battery cell's energy content, $\epsilon$, may be approximated from the equation $$\epsilon = \int \rho \cdot dt \quad (2)$$

where $\rho$ is the power applied to the cell over time. $\rho$ may be written as $$\rho = v_m \cdot i \quad (3)$$

where $v_m$ is the (measured) voltage associated with the power stored and i is the current associated with the power stored. Substituting (3) into (2) yields $$\epsilon = \int v_m \cdot i \cdot dt \quad (4)$$

$v_m$ may be written as $$v_m = \Delta v + V_{min} \quad (5)$$

where $V_{min}$ is the voltage of the cell at 0% state of charge (e.g., 3.1 V) and $\Delta v$ is the difference between the voltage associated with the power stored and the voltage of the cell at 0% state of charge. Substituting (5) into (4) yields $$\epsilon = \int (\Delta v + V_{min}) i \, dt \quad (6)$$

$\Delta v$ may be written as $$\Delta v = i \cdot \frac{v_{max} - v_{min}}{Ihr_{max}} \cdot t \quad (7)$$

where $V_{max}$ is the voltage of the cell at full state of charge, $Ihr_{max}$ is the cell's maximum capacity, and t is the time during which the change in voltage occurs. Substituting (7) into (6) yields $$\epsilon = \int \left( \left( i \cdot \frac{v_{max} - v_{min}}{Ihr_{max}} \cdot t \right) + V_{min} \right) i \, dt \quad (8)$$

where i is the charger current. Integrating (8) yields $$\epsilon = i^2 \cdot \frac{v_{max} - v_{min}}{Ihr_{max}} \cdot \frac{t^2}{2} + V_{min} \cdot i \cdot t \quad (9)$$

i·t may be written as $$i \cdot t = Ihr \quad (10)$$

which is the capacity in the cell. Substituting (10) into (9) yields $$\epsilon = \frac{v_{max} - v_{min}}{Ihr_{max}} \cdot \frac{Ihr^2}{2} + V_{min} \cdot Ihr \quad (11)$$

Cell Voltage Needed to Provide Specified Energy Content

Assume, for example, that a battery pack includes a string of cells each with a different Amp-hr capacity due to manufacturing tolerances, age, temperature, etc. Also assume that each cell voltage may be approximated by $$v_{cell} = (V_{max} - V_{min}) SOC + V_{min} \quad (12)$$

where $V_{max}$ is the voltage of the cell at full state of charge, $V_{min}$ is the voltage of the cell at 0% state of charge (e.g., 3.1 V), and SOC is the state of charge of the cell, or alternatively $$v_{cell} = \frac{V_{max} - V_{min}}{Ihr_{max}} \cdot Ihr + V_{max} \qquad (13)$$

where $Ihr_{max}$ is the cell's maximum capacity, and Ihr is the capacity in the cell.

If all of the cells are charged to the same voltage, each would have a different amount of Amp-hrs stored. The same current would pass through all of the cells during a subsequent discharge of the series string. From (12) or (13), the cells with lesser Amp-hr capacity would begin to have lower cell voltages compared to those with greater Amp-hr capacity. If none of the cells are allowed to discharge below $V_{min}$, then the cell with the least Amp-hr capacity would determine the end of the allowable string discharge even though some of the cells may still contain useable energy (i.e., SOC>0) if they could be tapped into separately.

Consider that the power provided by each cell, according to (3), is contributing to the total output power of the string. Again if all of the cells are charged to the same voltage, each would have a different amount of Amp-hrs stored. After the first instant of time in which the cells all have the same voltage, the cells with greater Amp-hr capacity will contribute more power and the cells with lesser Amp-hr capacity will contribute less power. The cells with greater Amp-hr capacity, from (2), will contribute more energy to meet the vehicle trip requirements. Hence, if it were hypothetically assumed that all cells had the capacity of the minimum Amp-hr cell and the cells were charged such that the sum of the cells' energy from (9) met the trip requirements, then in the actual string in which some cells have greater Amp-hr capacity, those cells would provide more energy. Less energy would be required of the minimum Amp-hr cell than expected and it would not be fully discharged at the end of the trip (i.e., SOC>0).

Alternatively, if all cells were charged to a voltage based on the maximum Amp-hr cell, then the minimum Amp-hr cell would not have enough Amp-hrs stored in it to allow completion of the trip. Given a final desired discharge voltage at the end of the trip, there is a voltage that all cells must be charged to between that of the minimum Amp-hr cell assumption and the maximum Amp-hr cell assumption.

A method of determining the desired voltage would include calculating the required cell voltage as above using the minimum Amp-hr cell, summing the string energy from (9), and comparing the calculated energy with the required trip energy (which may be determined in any suitable known/fashion based on, for example, trip distance, vehicle design parameters, etc.) If the energy is too great, then an incrementally smaller assumed voltage could be used and the summation process repeated until the desired energy level is reached. A similar process could also be used starting from the cell with the maximum Amp-hr capacity.

Battery Pack Charge Time

The target post-charge cell voltage may be determined as described above. From (12), the required SOC for the cells can be determined. If for example $V_{min}$=3 V and $V_{max}$=4 V, and the target post-charge cell voltage is 3.5 V, then from (12) the SOC for each of the cells would be 50%. Also, from (12) the initial SOC (the SOC prior to start of charge) can be calculated. The difference between the required SOC and the initial SOC is the required $\Delta$SOC that can be substituted into (1) to determine the $\Delta$Ihr required to charge an individual cell.

The time required to charge the battery pack is dependent on: the cell requiring the greatest $\Delta$Ihrs, the cell requiring the least $\Delta$Ihrs, the method of balancing the cells to the same voltage, and the portion of the charge cycle selected to balance the cells. Consider balancing, for example, by placing a resistor across a selected cell. This can be done during charge resulting in less current passing through the subject cell (current shunted through the resistor) resulting in a lower accumulated cell Amp-hrs or (conventionally at the end of charge) by repeatedly discharging the cells with the higher voltage and then charging the string until all cells are charged to the same voltage. Considering the time required for balancing during charge, the cell requiring the greatest $\Delta$Ihrs (i.e., $\Delta Ihr_{max}$) determines the amount of time to charge the battery. In this case, the charge time, $t_c$, is given by $$t_c = \frac{\Delta Ihr_{max}}{i_{chg}} \qquad (14)$$

where $i_{chg}$ is the charge current rate (Amps).

The time necessary to pass current around a selected cell, $t_{bc}$, would then be a function of $\Delta Ihr_{max}$, the Amp-hrs required of the selected cell, $\Delta Ihr_{cell}$, and the magnitude of the shunted current, $I_{shunt}$, as given by $$t_{bc} = \frac{(\Delta Ihr_{max} - \Delta Ihr_{cell})}{I_{shunt}} \qquad (15)$$

If any of the $t_{bc}$ values from (15) is greater than the $t_c$ value from (14), the time to charge the string of cells would exceed the actual required time to charge the battery. In that case, a portion of the balancing would need to be done at the end of charge as mentioned above (or at the beginning of charge). Alternatively, the charge current rate could be reduced such that $t_{bc} \leq t_c$.

Cell Voltage Balancing to Achieve Target Drive Range

Referring to FIG. 1, an embodiment of a plug-in hybrid electric vehicle (PHEV) 10 may include an engine 12, a plurality of cells 13 forming a traction battery 14, battery charger 15 and electric machine 16. The PHEV 10 may also include a transmission 18, wheels 20, controller(s) 22, and electrical port 24.

The engine 12, electric machine 16 and wheels 20 are mechanically connected with the transmission 18 (as indicated by thick lines) in any suitable/known fashion such that the engine 12 and/or electric machine 16 may drive the wheels 20, the engine 12 and/or wheels 20 may drive the electric machine 16, and the electric machine 16 may drive the engine 12. Other configurations, such as a battery electric vehicle (BEV) configuration, etc., are also possible.

The battery 14 may provide energy to or receive energy from the electric machine 16 (as indicated by dashed line). The battery 14 may also receive energy from a utility grid or other electrical source (not shown) via the electrical port 24 and battery charger 15 (as indicated by dashed line).

The controller(s) 22 are in communication with and/or control the engine 12, battery 14, battery charger 15, electric machine 16, and transmission 18 (as indicated by thin lines).

Figure 2:
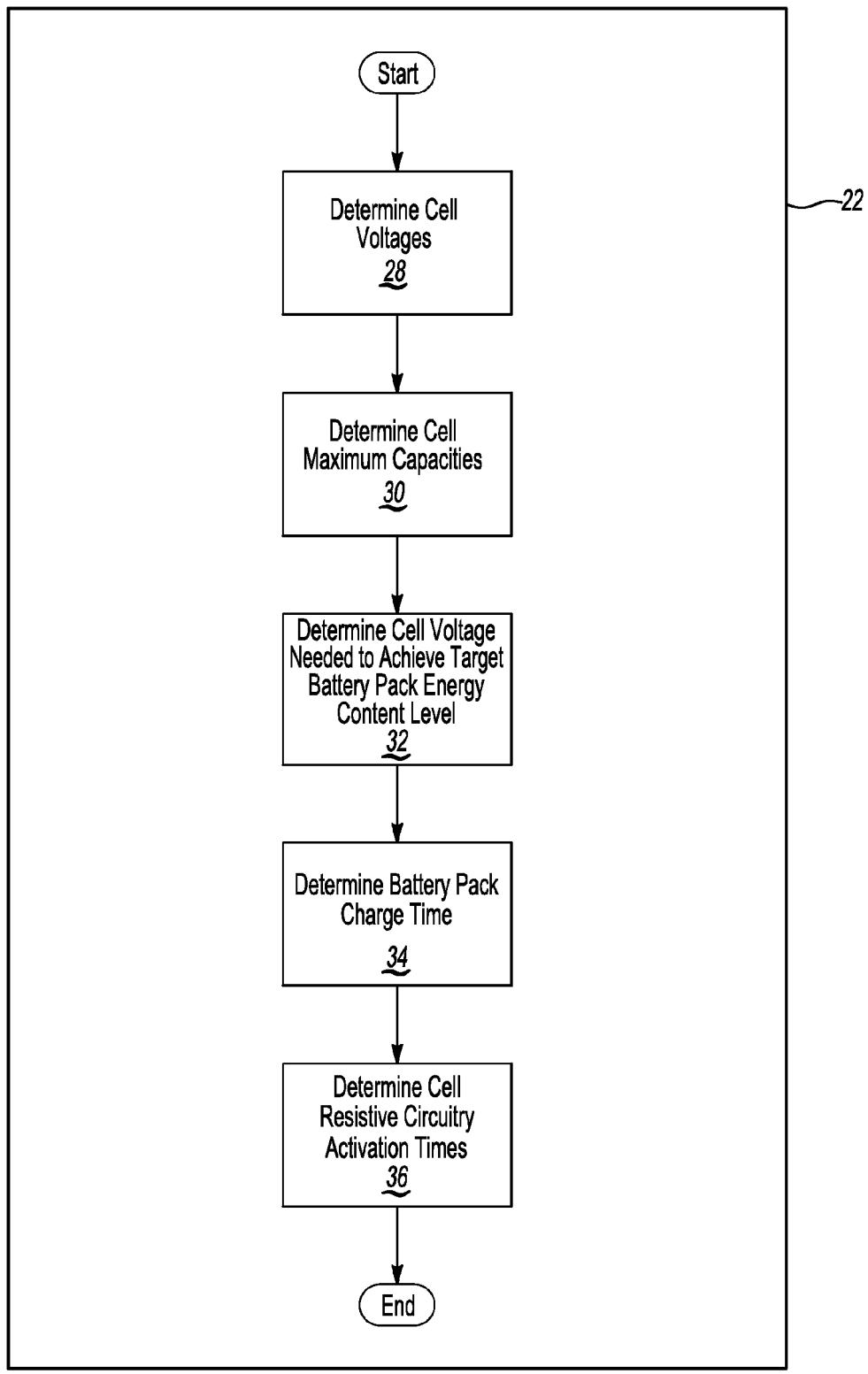
FIG. 2 is a flow chart illustrating an algorithm for determining times associated with rebalancing/charging the battery of FIG. 1.

Referring to FIGS. 1 and 2, the controller(s) 22 may determine (e.g., measure, read, etc.) the voltages of each of the cells 13 at operation 28. At operation 30, the controller(s) 22 may determine the maximum capacity of each of the cells 13 using, for example, the techniques described with respect to (1). At operation 32, the controller(s) 22 may determine the common voltage needed for each of the cells to support a target drive range (e.g. 100 miles) using, for example, the techniques described in the section titled "Cell Voltage Needed to Provide Specified Energy Content." At operation 34, the controller(s) 22 may determine the charge time for the battery pack 14 using, for example, the techniques described in the section titled "Battery Pack Charge Time." At operation 36, the controller(s) 22 may determine each of the cell's resistive circuitry activation time using, for example, the techniques described in the section titled "Battery Pack Charge Time."

Figure 3A:
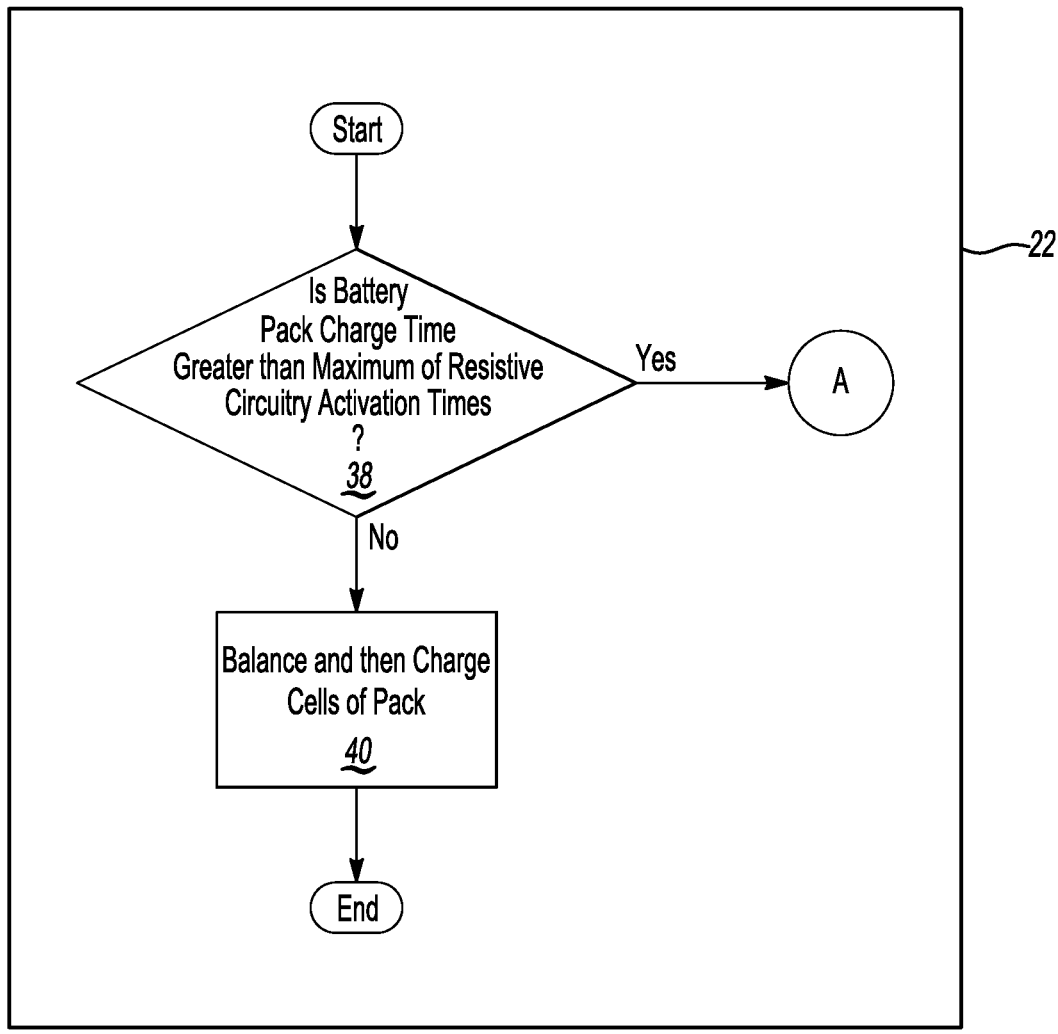
FIGS. 3A and 3B are flow charts illustrating an algorithm for rebalancing/charging the battery of FIG. 1.
Figure 3B:
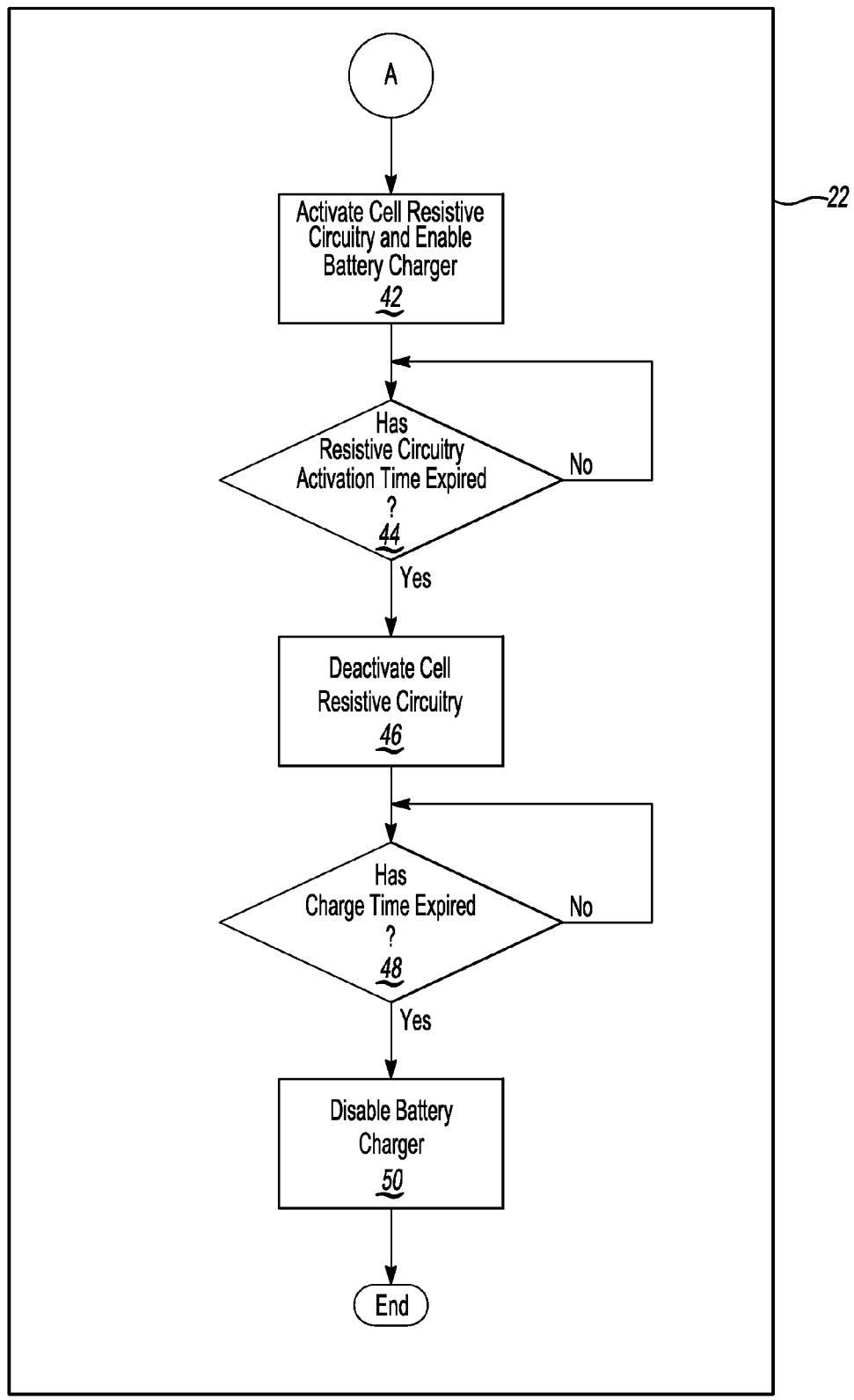

Referring to FIGS. 1 and 3A, the controller(s) 22 may determine, at operation 38 whether the pack charge time determined at operation 34 (FIG. 2) is greater than the maximum of the resistive circuitry activation times determined at operation 36 (FIG. 2). If no, the controller(s) 22 may first balance and then charge the cells 13 of the battery pack 14 at operation 40 using any suitable/known technique. If yes, referring to FIGS. 1 and 3B, the controller(s) 22 may activate, for each of the cells 13, the resistive circuitry and enable the battery charger 15 at operation 42. At operation 44, the controller(s) 22 may determine whether, for each of the cells 13, the cell's resistive circuitry activation time has expired. If no, the algorithm returns to operation 44. That is, for any of the cells 13 whose resistive circuitry activation time has yet to expire, the algorithm returns to operation 44. If yes, the controller(s) 22 may deactivate the cell resistive circuitry at operation 46. That is, for any of the cells 13 whose resistive circuitry activation time has expired, the controller(s) 22 may deactivate their resistive circuitry.

Once the resistive circuitry for all of the cells 13 has been deactivated, the controller(s) 22, at operation 48, may determine whether the battery pack charge time has expired. If no, the algorithm returns to operation 48. If yes, the algorithm may disable the battery charger 15 at operation 50. The cells 13 of the battery pack 14 have thus been balanced/charged to a target voltage sufficient to support a desired drive range.

The algorithms disclosed herein may be deliverable to/implemented by a processing device, such as the battery charger 15 or controller(s) 22, which may include any existing electronic control unit or dedicated electronic control unit, in many forms including, but not limited to, information permanently stored on non-writable storage media such as ROM devices and information alterably stored on writeable storage media such as floppy disks, magnetic tapes, CDs, RAM devices, and other magnetic and optical media. The algorithms may also be implemented in a software executable object. Alternatively, the algorithms may be embodied in whole or in part using suitable hardware components, such as Application Specific Integrated Circuits (ASICs), Field-Programmable Gate Arrays (FPGAs), state machines, or other hardware components or devices, or a combination of hardware, software and firmware components.

While embodiments of the invention have been illustrated and described, it is not intended that these embodiments illustrate and describe all possible forms of the invention. The words used in the specification are words of description rather than limitation, and it is understood that various changes may be made without departing from the spirit and scope of the invention.

What is claimed:

1. A vehicle comprising:
   an electric machine configured to generate motive power for the vehicle;
   a battery including a plurality of cells configured to store energy for the electric machine; and
   at least one controller configured to cause the cells to receive current for a predetermined period of time and, during the predetermined period of time, to cause at least some of the cells to supply cell load current such that at the expiration of the predetermined period of time, the cell voltages are approximately equal to a target voltage and the amount of energy stored by the cells is at least equal to a predetermined target energy level, wherein the predetermined period of time is based on the target voltage.

2. The vehicle of claim 1 wherein the at least one controller is further configured to determine, for each of the at least some of the cells, a duration of time to cause the cell to supply load current.

3. The vehicle of claim 2 wherein the at least one controller is further configured to, for each of the cells, determine an initial capacity of the cell and wherein the duration of time to cause the cell to supply load current is based on the initial capacity of the cell.

4. The vehicle of claim 2 wherein the at least one controller is further configured to determine whether each of the durations of time is less than the predetermined period of time.

5. A method for charging a vehicle battery comprising:
   causing cells of the battery to receive current for a predetermined period of time; and,
   during the predetermined period of time, causing at least some of the cells to supply cell load current such that at the expiration of the predetermined period of time, the cell voltages are approximately equal to a target voltage, wherein the predetermined period of time is based on the target voltage.

6. The method of claim 5 wherein the predetermined period of time is further based on a rate at which the cells receive the current.

7. The method of claim 5 wherein at the expiration of the predetermined period of time, the amount of energy stored by the cells is at least equal to a predetermined target energy level.

8. The method of claim 5 further comprising determining, for each of the at least some of the cells, a duration of time to cause the cell to supply cell load current.

9. The method of claim 8 further comprising determining, for each of the cells, an initial capacity in the cell and wherein the duration of time to cause the cell to supply cell load current is based on the initial capacity in the cell.

10. The method of claim 8 further comprising determining whether each of the durations of time is less than the predetermined period of time.

11. A power system comprising:
    a battery including a plurality of cells; and
    at least one controller configured to cause the cells to acquire charge for a predetermined period of time such that at the expiration of the predetermined period of time, the voltages of the cells are approximately equal to a target voltage, wherein the rate at which charge is acquired by the cells is different among at least some of the cells for at least a determined portion of the predetermined period of time and wherein the predetermined period of time is based on the target voltage.

12. The system of claim 11 wherein at the expiration of the predetermined period of time, the amount of energy stored by the cells is at least equal to a predetermined target energy level.

* * * * *